United States Patent [19]
Koniček

[11] 3,936,548
[45] Feb. 3, 1976

[54] METHOD FOR THE PRODUCTION OF MATERIAL FOR PRINTED CIRCUITS AND MATERIAL FOR PRINTED CIRCUITS

[75] Inventor: Jiri K. Koniček, Perstorp, Sweden

[73] Assignee: Perstorp AB, Perstorp, Sweden

[22] Filed: Feb. 27, 1974

[21] Appl. No.: 446,334

Related U.S. Application Data

[63] Continuation-in-part of Ser. No. 283,955, Aug. 28, 1972.

[30] Foreign Application Priority Data

Feb. 28, 1973 Sweden................................ 7302829
Feb. 28, 1973 Sweden................................ 7302830

[52] U.S. Cl..................... 427/405; 156/3; 156/155; 156/249; 204/38 B; 427/436
[51] Int. Cl.²..... B44D 1/34; C23F 1/34; C23F 1/44
[58] Field of Search....... 117/50, 71 M, 113, 114 A, 117/114 B, 130 R, 213, 217; 204/38 B; 156/3, 7, 155, 249; 427/98, 305, 405, 406, 433, 435–438

[56] References Cited
UNITED STATES PATENTS

| | | | |
|---|---|---|---|
| 2,662,831 | 12/1953 | Culverhouse.......................... | 117/50 |
| 3,155,536 | 11/1964 | Freeman et al................. | 117/130 R |
| 3,489,603 | 1/1970 | Darter et al. ........................ | 117/213 |
| 3,600,245 | 8/1971 | Gates..................................... | 156/22 |
| 3,726,771 | 4/1973 | Coll et al............................ | 204/38 B |
| 3,730,758 | 5/1973 | Laidman......................... | 117/114 A |

*Primary Examiner*—William A. Powell
*Attorney, Agent, or Firm*—Stevens, Davis, Miller & Mosher

[57] ABSTRACT

A method for the production of a material for printed circuits is disclosed. A temporary base is coated by electroplating with a thin, unbroken and unpatterned metallic layer having a thickness less than 17 μm and the free surface of said metallic layer is bonded to a final insulating base. The temporary base is thereafter removed and the desired wiring pattern is produced by a process comprising etching of the metal layer. A material for use in production of printed circuits is also disclosed comprising a temporary base which is coated by electroplating with a thin, unbroken and unpatterned metal layer having a thickness less than 17 μm. Said material can comprise a final, insulating base bonded to the free surface of the thin metal layer. The temporary base may be comprised of an aluminum foil coated with a layer of zinc or an aluminum foil to which has been applied zinc and which has the zinc replaced electrochemically by half or partly, by a layer of a metal which is more electro-positive than the metal zinc. In electroplating a thin, unbroken and unpatterned metallic layer onto the temporary base the electroplating takes place in a solution containing copper, pryophosphate and an acid, the pK-value of which is at least 0.8 at 20°C.

9 Claims, 17 Drawing Figures

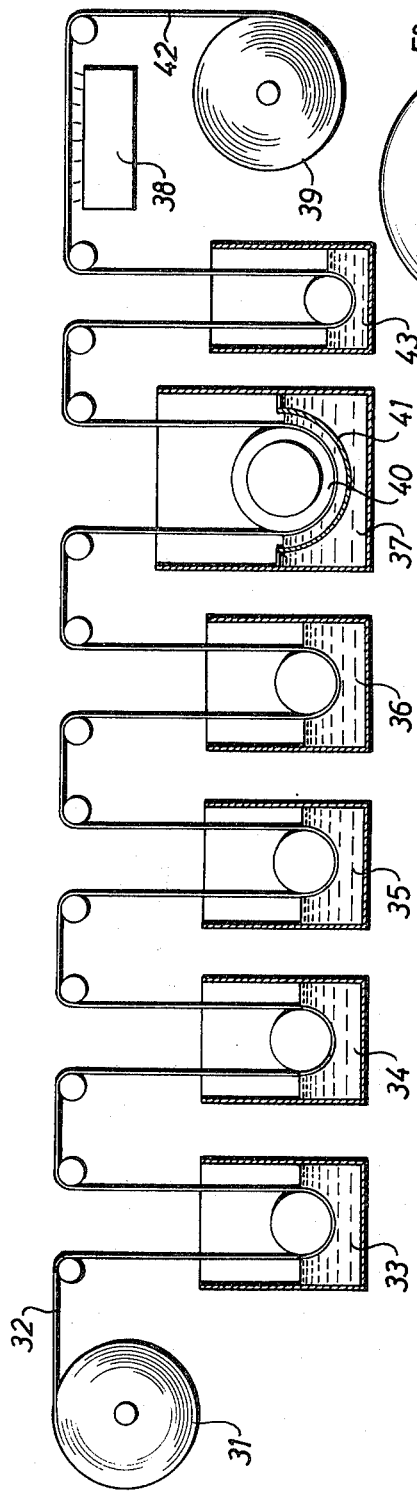
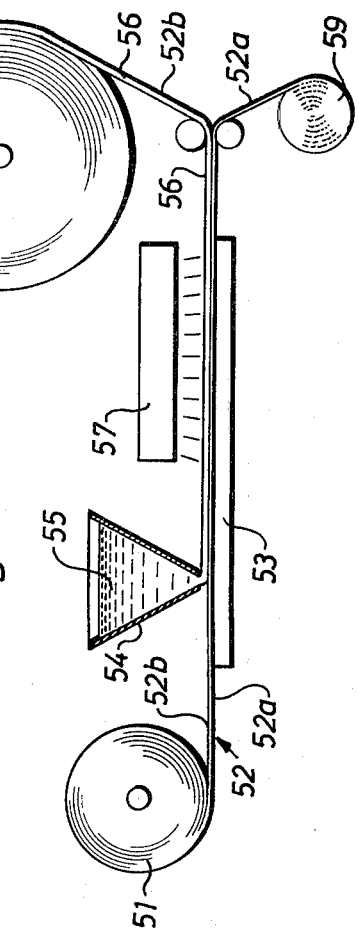
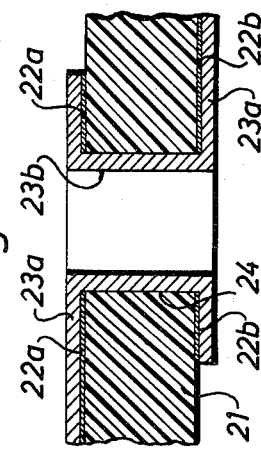

METHOD FOR THE PRODUCTION OF MATERIAL FOR PRINTED CIRCUITS AND MATERIAL FOR PRINTED CIRCUITS

This application is a continuation-in-part application of U.S. Ser. No. 283,955, filed Aug. 28, 1972.

The present invention relates to a method for producing material for printed circuits, said material comprising a thin layer of metal on an insulating carrier or base.

Printed circuits are used to a large extent in the electronics industry and are usually produced with a copperclad plastic laminate as a starting material. A copy of the desired wiring pattern is transferred to the copper layer by printing or by a photochemical method to which is applied so-called etch resist which acts as a protection during subsequent elimination by etching of the superfluous copper. Thereafter electronic components are mounted on the laminate carrying the circuit thus obtained. The copper of the board constitutes the electrical connections and the laminate provides the required mechanical support. This technique provides space and weight saving in the building of an electronic unit. This method of forming a circuit board produces a highly reliable product which is susceptible to mass production techniques.

The most common bases are paper-reinforced phenolic laminates which are used for comparatively simple circuits, and glass cloth reinforced epoxy resin laminates which are used where the technical requirements are high. Use is also made of fiber reinforced plastic laminates of other types. Base materials of plastic films and plastic coated metal plates also are used to a certain extent. For producing the copper coating or layer it is common to use copper foils or sheets which are placed on a base-forming fiber material impregnated with partially cured or hardened plastic (so called prepreg) whereupon the composite material is molded at high pressure and increased temperature. The final curing of the plastic is thereafter effected whereby the fiber material is converted into a sheet bonded to the copper foil. The copper foil usually has a thickness of 35 $\mu$m, but thicker and thinner foils also can be used. According to another known method the copper foil is glued to a plastic film by means of heat and pressure.

Owing to the rapid development of the electronics field the demand for printed circuits with good dimensional precision, especially in circuitry with narrow width lines and short distances between conductors, is increasing. Already at present printed circuits with a line width of 0.2 mm are required in many cases. Even smaller dimensions have been used and such a need will increase in the future. This development has led to a demand for laminates with thinner copper layers. Lately laminates with 17 $\mu$m thick copper foils have come into use to an increasing extent. By using thinner copper foils advantages are gained, i.a. a decrease of the so-called "undercut." By undercut is meant the elimination of copper under the etch resist caused by the etching solution which while dissolving the unprotected portions of the copper layer also eats into the copper covered by the etch resist. The undercut is a difficult problem causing unacceptably low dimensional accuracy especially in circuits with fine-line conductors. The effect of the undercut at varying thicknesses of the copper layer shall be explained in more detail in the following description.

By means of suitable technique it is possible to obtain a high degree of precision in the application of the etch resist proper. However, owing to the undercut, difficulties arise in maintaining good dimensional accuracy as to, for instance, the line width which the technique involving masking by means of an etch resist makes possible.

Some applications require very exactly defined distances between conductors even though being otherwise ordinary-dimensioned circuits. This is particularly true where electrical influence between conductors must be considered, i.a. in electronic systems which operate at high frequencies.

Thin copper-layer clad laminates can be used with advantage also for such systems.

There are other advantages as a result of thinner copper layers. Thus, the etching time is considerably reduced and the amount of etching solution consumed also is reduced. The amount of copper required for obtaining the copper layer is likewise reduced. Because of these advantages thin copper layers can be beneficial also if the requirements as to dimensional accuracy are not very high.

If an increased thickness of the copper conductor is desirable the thickness can be increased by chemically or electrolytically depositing copper according to known techniques. By either procedure copper is deposited only on the portion of the copper layer constituting the conductors of the final printed circuit which portion usually is the minor portion of the total surface of the printed circuit. By suitable techniques the increase of the thickness of the copper layers can be effected with good dimensional accuracy. In the case of insulation bases which are provided on both sides thereof with a conductor pattern of copper the increase of the copper thickness can suitably be carried out in connection with a so-called through-holes plating which is a method often used for providing electrical connections between the printed circuits on each side of the base and for providing holes for the mounting of electrical components. Thus, no extra process step is required to increase the thickness of the conductors. The method also provides the advantage that the main portion of the conductors of the circuit and the copper layer in the holes will consist of homogeneous and simultaneously deposited metal which is favorable from the point of view of reliability.

From the above discussion the advantages gained by using bases with thinner metal layers than what is used at present in the manufacture of printed circuits clearly appear.

In the usual method for the production of metal coated, insulating bases for printed circuits an unbroken or continuous, non-patterned metal foil or sheet is used as a starting material which foil is bonded to the base by molding at increased temperature or in other ways. The most commonly used metal foil is a copper foil produced electrolytically. Such a copper foil has a high degree of purity. However, numerous problems occur if an insulating base with a copper foil having a thickness less than 17 $\mu$m shall be produced according to the usual method, since there are many difficulties in connection with the practical handling of such thin copper foils. Another sizeable disadvantage of this known method in the case of very thin copper foils produced electrolytically is due to the fact that the copper foil often has cavities and through-going holes, so call micropores, the latter being, for reasons easily realized, more difficult to avoid with a decreased thickness of the foil. During the molding of the laminate still uncured resin material can penetrate through the pores and accumulate on the free surface of the foil where it can give rise to difficulties i.a. during the subsequent etching of the copper foil when the resin on the surface acts as an unwanted etch-resist.

Another method has been suggested according to which a thin copper layer is deposited on an insulating base by directly plating on the base. Such plating must be effected at least partly by methods other than electroplating since the carrier is of an insulating material. An applicable method is chemical plating which, however, is comparatively expensive and complicated. Thus, for instance, the surface of the laminate must often be pretreated to assure good bonding of the deposited copper. This pretreatment can give rise to deep cavities in the base which cavities will be filled by copper during the plating procedure. This necessitates relatively long etching time to assure that all copper is removed from the etched portions of the laminate. The prolonged etching time increases the production costs and also leads to an increased undercut even in the case of laminates with thin chemically deposited copper layers.

For completing the picture of the prior art in the manufacture of materials for printed circuits a method shall be mentioned which is described in U.S. Pat. No. 2,692,190. According to this patent a final wiring pattern of copper is applied to or formed on a temporary base whereupon this base with the pattern facing the final, insulating base, and with the resin material of the final base still uncured is molded to the final base. In the molding operation the wiring pattern usually penetrates the final base. After final curing or hardening the temporary base is removed, for instance by etching. This method has been described in connection with ordinary thicknesses for the copper layer and often has the purpose of providing a final printed circuit in which the surface of the wiring pattern is situated at the same level as the surrounding surface of the insulating base. This makes it possible to use so-called glide contacts in the circuit arrangement for which the circuit is to be used. However, it turns out that this known method has certain inconveniences which can cause trouble at least in certain applications. Some of these inconveniences are discussed in British Pat. No. 1,116,299. In connection with the present invention it shall be further pointed out that practical and economic difficulties arise when the method is used for the production of printed circuits requiring a very high degree of precision, i.a., in the manufacture of circuits with very narrow wiring pattern conductors and very short distances between the conductors. After the etching the temporary base with the wiring must be handled, transported and molded to the final insulating base. These steps combine to decrease the accuracy of the method. It also is to be understood that the method is practically unusuable for laminates with wiring patterns on each side of the final base and with so-called through-holes plating. Finally it should be recognized that an increase in the thickness of the copper conductors on the final base meets with great difficulty if a high degree of accuracy is desired.

The inconveniences of the known methods pointed out above are avoided to a very high degree by the present invention.

The method according to the present invention for the production of material having a layer of metal on an insulating base for printed circuits comprises applying by electroplating a thin, unbroken unpatterned metal layer having a thickness less than 17 $\mu$m to a temporary base, having a thickness of for instance about 30 $\mu$m preferably of a throw-away type, in the form of a metal foil aluminum, zinc, their alloys, steel, or a thin layer of metal on aluminum which is more electro-positive than zinc, strongly adhering the free surface of the said thin metal layer to a final, insulating base and removing the temporary base whereupon desired wiring patterns of printed circuits can be produced by a process comprising etching of metal layer bound to the final insulating base.

The thickness of the thin metal layer, should according to the present invention be between 1 and 15 $\mu$m, preferably between 2 and 10 $\mu$m, and can be, for instance about 5 $\mu$m.

According to the present invention it is not necessary to carry out the steps of the method immediately one after the other and in one and the same locality. The procedure can be divided in time and space by separately producing one or more intermediate products which are thereafter subjected to complementary treatment for carrying out the complete method according to the present invention.

The thin metal layer which is to form the wiring pattern can suitably consist of copper or nickel or their alloys. The metal layer can be a single layer or consist of a combination of two or more layers of different metals or alloys thereof. Other metals than those mentioned above and other combinations of metals also can be used.

The final, insulating base can suitably consist of a stiff sheet of plastic which may be fiber-reinforced, for instance a sheet of glass fiber reinforced epoxy resin, but it also can consist of a plastic film which may likewise be fiber-reinforced.

According to a further development of the present invention for application especially in the case when a foil of aluminum or an alloy thereof is used as a temporary base a relatively thin layer of zinc, tin or their alloys can be applied on the surface of the temporary base facing the metal layer, before applying the metal layer by electroplating.

The present invention also relates to a material for printed circuits produced by the method according to the present invention and to materials intended to be used in the form of intermediate products for carrying out the method. A first intermediate product consists of a temporary base of throw-away type in the form of a foil aluminum, zinc, their alloys, steel, a foil of aluminum upon which has been placed a layer of zinc or a layer of zinc on the temporary base being replaced electrochemically wholly or partly by a layer of a metal which is more electro-positive than the metal zinc, with at least one unbroken or continuous, thin layer of metal applied by electroplating. The layer has a thickness less than 17 $\mu$m, suitably a thickness of 1 – 15 $\mu$m, and preferably a thickness of 2 – 10 $\mu$m. A second intermediate product consists of the first intermediate product laminated or molded to the final insulating base with the thin metal layer facing the final base and bound thereto. The electroplating of the metal layer onto the temporary base may be accomplished by depositing the copper electrolytically from a copper cyanide solution or an acid copper solution, normally a sulphate copper solution.

However, when the copper is deposited electrolytically on the zinc-treated aluminum foil from, for instance, a copper cyanide solution or an acid copper solution, normally a sulphate copper solution, certain drawbacks result. One drawback with the solution containing cyanide is its poisonousness. It is here not only a question of environmental aspects and the costs for taking care of an neutralizing used plating solution, but also of the disadvantages and risks associated with the fairly large amount of poison which has to be handled at the working sites.

The difficulties are considerably reduced, if copper cyanide solution is avoided and the plating is performed in an acid copper solution directly on the zinc coated aluminum foil. However, this generally results in a very low adhesion between the copper layer and the zinc layer, and it is difficult to avoid blistering between the two layers at the subsequent processing steps.

Therefore, one of the objects of the present invention is to avoid the aforesaid disadvantages and to provide a material for printed circuits and a method for its production, which satisfies prevailing requirements as to the properties of the material and the influence on the environment.

According to the present invention a method for the production of a material for printed circuits has been devised in which a thin layer of zinc is first applied to the temporary base, the layer of zinc being then replaced electrochemically, wholly or partly, by a layer of a metal which is more electro-postive than the metal zinc, whereupon the copper layer is applied on the layer of said more inert metal by means of plating.

The material thus obtained may then be strongly bonded to a final insulating base with the copper layer facing said final insulating base, which may be, for instance, a plastic laminate. The laminate with the copper layer and the temporary base can then be used at any desired site for the production of printed circuits. For such production the temporary base in the form of an aluminum foil is first removed, for instance by etching, whereafter the desired wiring pattern is obtained by a method comprising etching on the copper layer bonded to the final base which copper after the temporary base has been removed may still be covered by a coating of said metal which is more electro-positive than zinc.

According to the present invention the layer of zinc on the temporary base is preferably replaced by nickel. The metal more electro-positive than zinc and moreover capable of being plated in an acid copper solution, is not limited to nickel since other metals such as, for instance, iron, chrome, tin, cadmium and cobalt may be chosen. The average thickness of the layer of nickel thus obtained is suitably at least 0.01 $\mu$m but not more than 1 $\mu$m, for example 0.05 to 0.5 $\mu$m. The replacement of zinc by nickel can suitably be carried out in a solution in which the Ni++-concentration is 2 to 25 g/l (grams per liter), preferably 5 to 15 g/l, e.g., about 8 g/l. Nickel chloride has proved to be a suitable supplier of nickel ions in the solution, the pH value of which generally ought to be between 0.5 to 5, preferably between 1 and 3.

The plating of copper on the layer of nickel may be performed in an acid copper solution.

With regard to the removal of the temporary base from the copper layer the possibility of removing the temporary base by hand or with the aid of mechanical means has several practical advantages for many applications. When the temporary base is peeled off this can be performed rapidly and easy and it does not cause any appreciable problems with waste products, which by contrast, is the case if the temporary base is removed for instance by etching. The water products produced when the temporary base is etched are solutions of aluminum salts and hydrogen gas, which require special protective measures. For the production of copper-coated foils of aluminum by plating first in a copper cyanide solution and then in a strongly acid (sulfuric acid) copper solution an adhesion between the foil of aluminum and copper is obtained, which is so adjusted that the foil of aluminum can be peeled off. The use of a copper cyanide solution, however, creates special problems regarding toxicity.

At the same time as it is desirable to be able to peel off the foil of aluminum, which necessitates a relatively low degree of adhesion between aluminum and copper, a certain degree of adhesion between the two metal layers is required to prevent unintentional separation of said layers from each other at the handling of the product. Consequently the degree of adhesion between aluminum and copper must lie between two limits. The upper limit is determined by the requirement that it must be possible to peel off the foil of aluminum without the layer of copper or parts of it being separated from the final base, and this peeling off should preferably be possible to perform by hand from larger surfaces without too much effort. The lower limit is determined by the requirement that it must be possible to handle the copper coated foil of aluminum at various stages of the production process without the two metal layers becoming separated from each other. Another factor which necessitates a certain minimum adhesion between aluminum and copper is connected with the presence of small through-going holes, so called mircopores, in the plated copper layer. These micropores which in practice are difficult completely to avoid, lead to risks for small resin patches being formed on the surface at the production by high pressure molding of, for instance, glass fiber reinforced plastic epoxy laminate. This is due to the fact that during the molding, which occurs at an elevated temperature, the resin passes a state of relatively low viscosity before it is hardened and is transformed into the solid state. In its fluid state some of the resin may be pressed through the micropores to form small patches on the surface of the copper. These resin patches cause difficulties at the production of circuits for instance by etching. This problem is avoided if the adhesion between aluminum and copper is so high that the foil of aluminum forms a barrier which prevents the resin from penetrating to the surface of the copper layer. As the aluminum foil during the molding operation is pressed against the one surface of the copper layer with the same force as the resin is pressed in the opposite direction, the adhesion between aluminum and copper, it is true, needs not amount to a very high value, but on the other hand it must not be so low that the resin during the molding operation can penetrate between the copper layer and the aluminum foil at those points where the adhesion between them is particularly weak.

Therefore another object of the present invention is to provide a method for plating a foil of aluminum or an aluminum alloy with a layer of copper for production of a material for printed circuits which secures such an adhesion between the copper layer and the foil of aluminum that the above mentioned requirements are fulfilled.

The method according to the present invention is characterized in principle in that the plating is performed in a solution containing copper, pyrophosphate, and an acid, the pK value of which is at least 0.8 at 20°C.

According to the present invention the pH value of the plating solution is adjusted to between 3.5 and 9, preferably to between 5 and 8, by means of, e.g., ammonium hydroxide or an amine.

The content of copper in the plating solution expressed as metal should be 5 to 50 g/l, preferably 10 to 30 g/l, and the content of pyrophosphate calculated as the content of the pyrophosphate group ($P_2O_7$) should be 5 to 400 g/l, preferably 25 to 250 g/l, e.g., about 70 g/l. At the plating the current density can be between 2 and 35 A/dm$^2$, preferably between 5 and 20 A/dm$^2$, and the temperature of the solution can be 30° to 100°C.

The acid in the solution can suitably be oxalic acid or a similar organic or inorganic, weak acid.

A measuring method, which suitably can be used for determining the degree of adhesion between a base and a layer adhering to it, for instance a foil, and which is frequently used in practice for copper-clad laminates designed for printed circuits, is ASTM D-1867. According to this method the strength is measured which is required for peeling off a strip of foil perpendicularly to the base.

The adhesion as measured according to this method is to a certain extent dependent on the thickness and the rigidity of the foil. Practical experiments have shown that when the adhesion of a rolled 50 $\mu$m thick aluminum foil to a base is not more than about 0.5 kp/cm as measured according to ASTM D-1867, the foil can easily be peeled off by hand power. When mechanical facilities are used higher values, e.g., up to about 1.0 kp/cm, can be allowed. If the base as in the present invention is a layer of copper which in its turn is bonded to a final base, for instance a laminate, there is no risk that the copper layer will be peeled off from the final base provided that the adhesion between the two last mentioned materials amounts to values generally accepted in practice. For glass web reinforced epoxy plastic laminates to which a foil of copper having a thickness of 35 $\mu$m is bonded, the adhesion between the copper foil and the laminate shall be at least 8 lbs/inch = 1.43 kp/cm, measured according to ASTM D-1867.

In practical experiments with a material consisting of an aluminum foil having a thickness of 50 $\mu$m plated with a copper layer, it has, however, turned out that, as the adhesion between the two layers of metal is less than about 0.01–0.02 kp/cm, the metal layers will easily become separated from each other during the handling of the material. In view of the aforesaid it is reasonable to establish that the adhesion between the aluminum foil and the copper layer ought to be within the limits 0.01 and 1.0 kp/cm at measurements performed according to ASTM D-1867 on rolled aluminum foil having a thickness of 50 $\mu$m. Good results are obtained within the limits 0.05 and 0.5 kp/cm. The adhesion should preferably be between 0.05 and 0.3 kp/cm.

The effect of the aluminum foil as a barrier against penetration of resin in the production of a laminate by molding can be easily tested by etching away the copper layer from the final base. If during the molding operation resin has penetrated through the micropores and formed small patches on the surface of the copper, residues of copper will remain on the final base after the etching, because the patches of resin have acted as etching masks preventing the copper under the patches from being etched away. Experiments have shown that, even at as low an adhesion as 0.005 kp/cm, no residues of copper remained on the final base after the etching operation. In these experiments the final base consisted of a glass web reinforced epoxy resin laminate. In experiments for comparison in which the copper layer was peeled off from the foil of aluminum before the molding operation small patches having a diameter of about 3 mm were obtained on the surface of the epoxy laminate after etching.

The present invention will be more fully described hereinbelow with reference to the drawings. In the drawings, FIGS. 1–3 illustrate the influence of the thickness of the copper layer on the so-called undercut in an etching procedure;

FIG. 15 illustrates the result after so-called through-holes plating;

FIG. 16 shows schematically a device for producing, according to the present invention, materials for printed circuits; and FIG. 17 illustrates schematically a further embodiment of the method according to the present invention.

Figure 1:
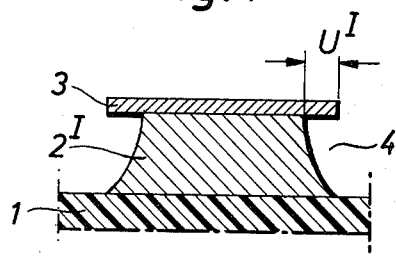
Figure 2:
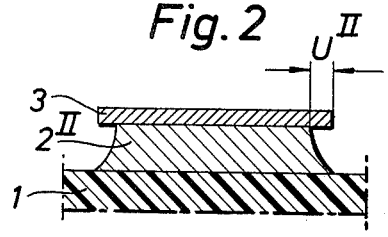
Figure 3:
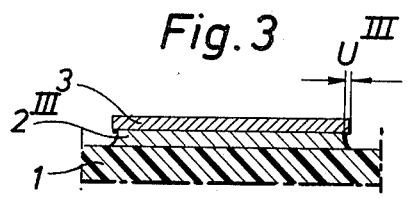

In FIGS. 1–3 there is shown in cross-section a metal layer of copper $2^I$, $2^{II}$ and $2^{III}$ respectively, of a printed circuit. The copper layer is bonded to an insulating base 1 and covered by an etch resist 3. In FIG. 1 reference 4 designates the cavity in the metal layer under the etch resist caused by the etching. $U^I$ is the measure of the undercut. In FIGS. 2 and 3 the undercut is designated by $U^{II}$ and $U^{III}$, respectively. The metal layer $2^I$ according to FIG. 1 is relatively thick, i.e., about 35 $\mu$m, and requires an extensive etching time. The undercut in this case is considerable. The metal layer $2^{II}$ in FIG. 2 is thinner, i.e., about 17 $\mu$m, and the undercut $U^{II}$ is considerably less than $U^I$ of FIG. 1. The metal layer $2^{III}$ is very thin, for instance about 5 $\mu$m, and requires only a short etching time. The undercut $U^{III}$ is negligible even when the conductors formed by the metal layer are of a very small width.

Figure 4:
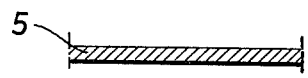
FIGS. 4–10 illustrate steps of a method according to one embodiment of the present invention.
Figure 5:
Figure 6:
Figure 7:
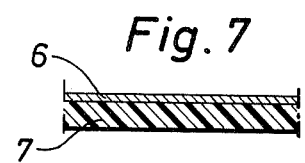
Figure 8:
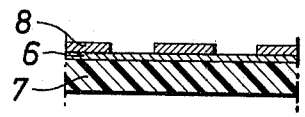
Figure 9:
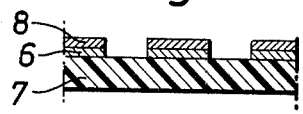
Figure 10:
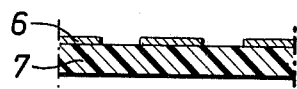

FIGS. 4 – 10 illustrate a method according to the present invention. FIG. 4 illustrates a temporary base 5 of aluminum. In FIG. 5 a thin copper layer 6, with a thickness less than 17 $\mu$m is deposited by electroplating to 5. In FIG. 6 the material according to FIG. 5 is thereafter laminated or molded with a final, insulating base 7, for instance of glass fiber reinforced epoxy resin, with the copper layer facing the final base. The temporary base 5 is removed, for instance by peeling or by etching as shown in FIG. 7. On the product of FIG. 7, an etch resist 8 is then applied which corresponds to a desired pattern as seen in FIG. 8. The uncovered portions of the thin copper layer are removed thereafter by etching as shown in FIG. 9. After dissolving the etch resist 8 the final printed circuit is obtained as in FIG. 10.

Figure 12:
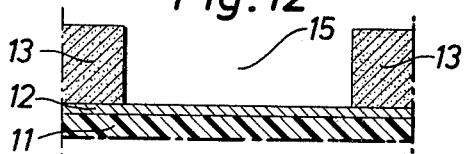
FIGS. 12–14 illustrate the steps of a method according to the present invention in which the thickness of the wiring pattern forming portions of a thin metal layer are increased by plating, whereupon the other portions of the metal layer are removed by etching.
Figure 13:
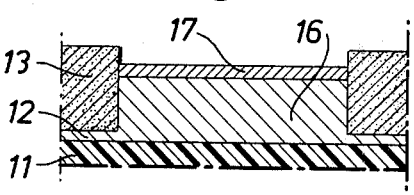
Figure 14:
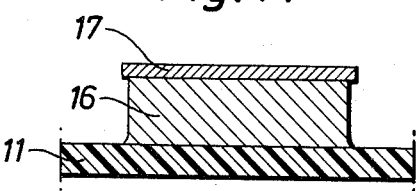

The material shown in FIG. 7 can, as shown in FIGS. 8 and 9, be used as such, in which case the advantage is obtained that the undercut is negligible. This advantage can, however, be maintained also if it is desired to produce wiring patterns with increased conductor thickness. FIGS. 12 - 14 show how this can be achieved.

On an insulating base 11 a copper layer 12 with a thickness of, for instance, 5 $\mu$m has been deposited by means of a method according to the present invention. For increasing the thickness of the conductors a mask 13 corresponding to the negative of the desired conductor pattern is first applied to the copper layer 12, as shown in FIG. 12. Thereafter further copper 16 is deposited on the layer 12 by electroplating until the desired conductor thickness, for instance 35 $\mu$m, has been obtained whereupon a different metal serving as an etch resist 17 is applied to the deposited copper, all as shown in FIG. 13. Finally the mask 13 is dissolved and the thin copper layer covered by the mask is removed by etching which takes only a short time. The result is shown in FIG. 14 from which appears that a conductor with a considerable thickness for instance 35 $\mu$m, and with very accurate dimensions has been achieved, the latter thanks to the absence of mentionable undercut.

In FIG. 15 a so-called through-holes plating method is illustrated which suitably can be carried out simultaneously with plating for achieving increased conductor thickness as illustrated in FIGS. 12-14. An insulated base 21 is provided on each side thereof with a very thin copper layer 22a and 22b respectively, by a method according to the present invention. In the composite material through-going holes 24 have been made, for instance by drilling. After pretreatment of the holes and after masking in a known manner plating is carried out whereby the deposited copper material is applied on the unmasked portions of the thin copper layer and on the inner walls of the holes until the desired plating thickness has been achieved. After removing the mask and etching the underlying portions of the copper layer the final product shown in FIG. 15 is obtained. It appears that the deposited copper layers 23a on the thin copper layers and the deposited copper layers 23b on the walls of the holes 24 become approximately equally thick and have good connection to each other which is of great importance from the point of view of reliability.

The temporary base used in the method according to the present invention need and should not be thicker than what is required for forming and supporting the thin copper layer so that the composite material consisting of the temporary base and the copper layer can be handle comfortably during the further processing. The temporary base should preferably be of the throwaway type so that it can be destroyed after use. The thickness of the temporary base depends on the stiffness of the materials used but should suitably be not more than 0.2 mm, preferably not more than 0.1 mm and can be, for instance, about 0.03 mm.

A further advantage of the present invention is that the temporary base can serve as protection against oxidation, scratching and other damage of the thin metal layer during transport, storing and mechanical treatment of the laminate. The temporary base is then removed in connection with the manufacture of the printed circuit.

Another advantage is related to the aforementioned presence of through-going holes, so-called micropores, in the copper layer, said micropores being difficult to avoid in an electroplating process. These micropores create, as mentioned, difficulties, since part of the resin flows through the micropores to the surface of the copper during the high pressure molding step, e.g., in the manufacture of glass cloth reinforced epoxy resin laminate. These patches of epoxy resin on the copper surface are highly harmful in the manufacture of the printed circuit both in the etching, plating and soldering steps. The thinner the copper foil the more difficult it is to avoid this problem. The present invention solves the problem, since the temporary base constitutes an effective barrier during the molding operation to preventing any flow through of resin onto the surface of the copper layer.

Before the temporary base with the copper layer is molded to the final base it is preferable to subject the copper to a surface treatment for improving the bond between the copper and the resin of the final base. This surface treatment often makes the surface of the copper uneven. The thickness of the deposited copper layer is therefore calculated as an average thickness. An average thickness of 10 $\mu$m corresponds to a surface weight of about 87 g/m$^2$.

The method according to the present invention is further illustrated by the following examples.

EXAMPLE 1

An aluminum foil (50 $\mu$m) was washed in a cleaning solution consisting of water, sodium carbonate and sodium phosphate. The foil then was washed in water and thereafter electroplate in a water solution containing

| | |
|---|---|
| Cu (CN)$_2$ | 25 g/l |
| NaCN | 20 g/l |
| Na$_2$CO$_3$ | 30 g/l |
| NaOH | 3 g/l |
| Rochelle Salt | 70 g/l | for 2 minutes at 45°C. with a current density of 15 mA/cm$^2$. After washing the foil was electroplated for 2 minutes with a current density of 50 mA/cm$^2$ at a temperature of 42°C. in a water bath containing

| | |
|---|---|
| CuSO$_4$ | 170 g/l |
| H$_2$SO$_4$ | 50 g/l |

Thereafter the electroplating was carried out in the same bath at a current density of 200 mA/cm$^2$ during 2 minutes for achieving a surface with high crystallinity and good adhesion to epoxy resin. A copper layer with a thickness of 5 $\mu$m was obtained.

After the electroplating the aluminum foil was washed and dried whereupon it was placed on a few sheets of an epoxy resin impregnated glass web with the copper coated surface facing said sheets. The laminate was molded under pressure after which the aluminum foil was peeled off.

The copper layer bound to the final laminate had an adhesion to the base, so-called peel strength, of 8.5 lbs/in measured according to the standardized measuring method ASTM D/1867 after increasing the thickness of the copper layer by electroplating to 35 μm. The thickness of the metal layer obtained by electroplating can be changed in a simple manner by varying the electroplating time and/or the current density. On the laminate thus obtained a wiring pattern for the desired printed circuit was thereafter etched in a known manner.

EXAMPLE 2

A laminate was produced in the manner according to Example 1 but the aluminum foil was etched away in hydrochloric acid instead of being removed mechanically by tearing. The peel strength was 9.0 lbs/in.

EXAMPLE 3

A zinc foil (80 μm) was electroplated in a bath consisting of

| | |
|---|---|
| $CuSO_4 \cdot 5H_2O$ | 220 g/l |
| $H_2SO_4$ | 100 g/l | during 2 minutes at 20°C. with a current density of 100 mA/cm². After washing the foil was electroplated during 20 seconds at room temperature in the same electroplating bath with a current density of 500 mA/cm². Thereafter electroplating took place in the same bath for 30 seconds at a current density of 50 mA/cm². A copper layer of 6 μm was thereby obtained. After molding according to Example 1 the zinc foil was etched away by means of hydrochloric acid. On the final laminate the copper layer had a peel strength of 12 lbs/in.

EXAMPLE 4

A steel foil (100 μm) was electroplated in a bath consisting of

| | |
|---|---|
| $CuP_2O_7$ | 50 g/l |
| $K_2P_2O_7$ | 250 g/l | for 2 minutes at 35°C. with a current density of 24 mA/cm². After washing the foil was electroplated for 3 minutes at 35°C. in a electroplating bath consisting of

| | |
|---|---|
| $CuSO_4 \cdot 5H_2O$ | 225 g/l |
| $H_2SO_4$ | 100 g/l | at a current density of 100 mA/cm².

The foil was thereafter electroplated at 35°C. in the same bath for 20 seconds at a current density of 500 mA/cm². Thereafter the foil was electroplated once again at 35°C. in the same bath for 20 seconds at a current density of 100 mA/cm².

A copper layer with a thickness of 10 μm was obtained. After molding according to Example 1 the steel foil could be peeled off. The copper layer of the final laminate had a peel strength of 10.5 lbs/in.

EXAMPLE 5

An aluminum foil was electroplated with a 5 μm thick copper layer in the manner described in Example 1. Thereafter the foil was molded under heat and pressure to a 75 μm thick plastic film of polyethylene terephthalate with the copper coated surface facing the film. As a binding agent heat curing polyurethane resin was used. After bonding the metal foil to the plastic film the aluminum foil could be peeled off. A flexible laminate consisting of a plastic film coated with a 5 μm thick copper layer was obtained.

EXAMPLE 6

An aluminum foil was electroplated with a 10 μm thick copper layer in the manner described in Example 1. Thereafter the foil was placed on a sheet of "nonwoven" cloth of polyester fiber which had been impregnated with a partly cured epoxy resin. The copper coated surface of the foil faced the impregnated cloth. After molding at a raised temperature the aluminum foil could be peeled off. The copper clad laminate obtained had good flexibility.

EXAMPLE 7

An aluminum foil was electroplated with a 3 μm thick copper layer in the manner described in Example 1. Thereafter the copper clad surface of the foil was coated with a 75 μm thick layer of partly cured epoxy resin of the heat resistant type. A 1 mm thick copper plate was also coated with a 75 μm thick layer of partly cured epoxy resin of the same type. By electrolytical treatment the surface of the copper plate was placed in a condition giving good adhesion to epoxy resin. The foil and the copper plate were molded together under heat and pressure with the epoxy resin coated surfaces facing each other. Thereafter the aluminum foil was etched away in hydrochloric acid. The final laminate consisted of a copper plate and a 3 μm thick copper layer with an electrically insulating layer of epoxy resin therebetween. The copper plate assured effective dissipation of heat from a heated article which was soldered to the thin copper layer.

From an economical point of view the most advantageous temporary base to be used according to the present invention is an aluminum foil which is cheap, easy to etch and gives less dangerous waste products from the point of view of environmental protection. The use of such a foil however, is not free from problems. It is difficult to obtain good adhesion of a metal layer on an aluminum foil by electroplating. This is true, i.a., if it is desired to apply a copper layer on the foil In this case it is usually necessary to utilize a cyanide containing plating bath which gives rise to waste products which are dangerous to the environment. The handling of cyanides during the plating process also involves risk.

Figure 11:
FIG. 11 illustrates the result of a modified method.

According to an embodiment of the present invention a temporary base of aluminum foil is used which is coated with a thin layer of zinc or tin, preferably of a thickness less than 2 μm, after which the thin metal layer is applied to the zinc or tin coating by electroplating. The adhesion between the meal, for instance copper, and the zinc or tin layer is very good, and one also can avoid the use of cyanide containing solutions, if desired. FIG. 11 shows how a temporary base 5 of aluminum has been provided with a thin layer of zinc 9 on which a copper coating 6 has been deposited by electroplating.

EXAMPLE 8

A hard-rolled aluminum foil was treated for 1 minute at room temperature in a zincate solution consisting of

| | |
|---|---|
| ZnO | 95 g/l |

-continued

| | |
|---|---|
| NaOH | 520 g/l |

After the treatment it was found that the foil was covered by a layer of zinc. The zinc layer was dissolved by immersion in 50% $HNO_3$, whereby a clean aluminum surface was obtained. The aluminum foil was thereafter treated once again in the abovementioned zincate solution for 1 minute at room temperature, whereby a thin zinc layer with good adhesion to aluminum foil was obtained.

The aluminum foil thus treated was electroplated with nickel in a Watts' solution consisting of

| | |
|---|---|
| Nickel sulphate | 300 g/l |
| Nickel chloride | 45 g/l |
| Boric acid | 180 g/l | for 3 minutes at 50°C. and a current density of 50 mA/cm$^2$. Thereafter the plating was continued for 1 minute in the same bath at 50°C. and with a current density of 150 mA/cm$^2$.

The electroplated aluminum foil was placed on a few sheets of epoxy resin impregnated glass cloth with the nickel coated surface facing said cloth. The laminate was molded after which the aluminum foil with the zinc layer was dissolved by means of $H_2SO_4$. A laminate coated with a 5 μm thick nickel layer was obtained. The strength of the bond between the nickel layer and the epoxy glass fiber laminate, i.e., the peel strength, measured on a 35 μm thick foil was 12 lbs/in.

EXAMPLE 9

A hard-rolled aluminum foil was immersed for 3 minutes in a 5% NaOH-solution. Thereafter the foil was immersed for 1 minute in a zincate solution of

| | |
|---|---|
| NaOH | 60 g/l |
| ZnO | 6 g/l |
| $FeCl_3 . 6H_2O$ | 2 g/l |
| Rochelle salt | 55 g/l |
| $NaNO_3$ | 1 g/l |

The zinc-treated aluminum foil was electroplated with brass for 6 minutes at 60°C. and a current density of 40 mA/cm$^2$ in a bath containing

| | |
|---|---|
| CuCN | 55 g/l |
| $ZN(CN)_2$ | 31 g/l |
| NaCN | 95 g/l |
| $Na_2CO_3$ | 35 g/l |
| $NH_4OH$ | 10 g/l |

A laminate was produced according to the procedure of Example 8. The temporary base was dissolved by means of $H_2SO_4$ after the molding. A laminate with a 4 μm thick brass layer was obtained. The proportion between copper and zinc of the brass was about 70:30. The peel strength was 6 lbs/in.

EXAMPLE 10

A hard-rolled aluminum foil was zinc-treated according to the procedure of Example 8. Thereafter the foil was electroplated with brass for 5 minutes at room temperature and a current density of 50 mA/cm$^2$ in a bath containing

| | |
|---|---|
| CuCN | 20 g/l |
| $Zn(CN)_2$ | 45 g/l |

-continued

| | |
|---|---|
| NaCN | 50 g/l |
| $Na_2CO_3$ | 32 g/l |
| NaOH | 30 g/l |
| Rochelle Salt | 5 g/l |

A laminate was produced according to the procedure of Example 8. The temporary base was dissolved by means of $H_2SO_4$ after the molding. A laminate with a 5 μm thick layer of brass was obtained. The proportion between copper and zinc of the brass was about 40:60. The peel strength was 6 lbs/in.

EXAMPLE 11

An aluminum foil which had been zinc-treated according to the procedure of Example 8 was plated at room temperature of 1, 2, 5 or 10 minutes respectively at a current density of 60 mA/cm$^2$ in an acid copper solution containing

| | |
|---|---|
| $CuSO_4 . 5H_2O$ | 200 g/l |
| $H_2SO_4$ | 70 g/l |

Thereafter the foil was electroplated at room temperature in the same solution for 20 seconds at a current density of 200 mA/cm$^2$ and thereafter for a further period of 20 seconds at a current density of 50 mA/cm$^2$.

Laminates were produced in the same manner as they were produced in Example 8. After the molding the temporary base was peeled off. The laminates were coated with a copper layer with a thickness of 4 μm, 5 μm, 8 μm and 13 μm respectively. The adhesion to the final base was about 11 lbs/in.

The thickness of the metal layer obtained by electroplating can thus simply be changed by varying the plating time which is shown in Example 11.

FIG. 16 illustrates schematically a continuous process according to the present invention for the manufacture of a material for printed circuits consisting of an aluminum foil with a very thin copper coating deposited thereon. An aluminum foil 32 is drawn from a storage roll 31, is passed through cleaning bath 33 and washing bath 34 containing $Na_2CO_3$, $Na_3PO_4$ or NaOH and thereafter is pretreated by means of a zincate or stannate solution 35 for depositing a thin layer of zinc and tin, respectively on the aluminum foil. After a further washing in a suitable liquid 36 the foil is led down into solution 37 in a device for electroplating the surface of the foil coated with zinc and tin, respectively, for obtaining a thin copper layer thereon. Solution 37 for instance, can be a solution of copper sulphate, copper pyrophosphate or copper cyanide. The foil on the roll 40 serves as a cathode while plate 41 is an anode for the electroplating procedure. After the electroplating the product is washed in bath 43 and is dried by means of a device 38, whereupon the copper coated aluminum foil 42 thus obtained is wound up on the roll 39. The described process serves only as an illustration. Certain process steps can be eliminated and others can be added. Thus, for instance, further plating steps can be undertaken in certain cases.

The present invention also relates to a modified method which is especially advantageous technically and economically in the manufacture of certain types of metal coated plastic films. According to this method the thin metal layer carried by the temporary base is coated with a layer of a resin solution or a prepolymer or a solution of a prepolymer. It also is possible to use resin dispersions, melts or other liquid phases of the resin or its prepolymer. The deposited layer is transformed to solid phase for instance by evaporation of the solvent and polymerizing the prepolymer. Thereafter the temporary base can be removed, whereupon a plastic film coated with the very thin metal layer is obtained. Examples of metal coated plastic films which can be manufactured with advantage by means of this process are films of polybenzoxazole, polybenzimidazole, polyimide and polybutadiene resins. These plastics have good dielectric properties and good heat resistance which is advantageous in printed circuitry. Such metal coated plastic films find use for instance in the manufacture of flexible printed circuits.

FIG. 17 illustrates schematically a continuous process according to this modified method. From a storage roll 51 for a foil 52 which if desired, can consist of the final product 42 obtained by the process according to FIG. 16, the foil is drawn horizontally over a support 53, it being assumed that the underside of the horizontal foil is constituted by a temporary base in the form of a metal foil 52a and the upper side is constituted by a metal foil deposited on the temporary base by means of electroplating and consisting of a thin layer 52b, for instance of copper. From a container 54 is drawn a fluid prepolymer 55 of a resin suitable for forming a final, insulating base of the material for printed circuits to be produced. The metal layer is coated with the prepolymer which is thereafter brought to final polymerization by means of a suitable apparatus 57 whereby a strong, flexible film 56 is obtained. After removing the metal foil 52a which is wound up on a roll 59 the film 56 with the thin metal coating bonded thereto is wound up on a roll 58. For the sake of simplicity further process steps which can be undertaken for instance pretreatment of the component foil materials have not been shown in FIG. 17. From the roll 59 the metal foil can go to replating, if desired. Instead of peeling off the temporary base the latter can be removed in any other manner for instance by etching, which can be carried out with advantage in immediate connection with the manufacture of the printed circuit.

EXAMPLE 12

An aluminum foil with a copper layer with a thickness of 5 μm was produced according to Example 11. The free copper surface was coated with a layer of a solution consisting of

| | |
|---|---|
| Polybenzoxazole, prepolymer | 15 parts by weight |
| Dimethylacetamide | 85 parts by weight |

The dimethylacetamide was evaporated in an oven while gradually increasing the temperature from 60°C. to 160°C. for 60 minutes. Thereafter the temperature was increased to 300°C. which temperature was maintained for 45 minutes. During the last mentioned treatment which was carried out in a nitrogen gas atmosphere the prepolymer underwent a chemical reaction so that an aromatic polybenzoxazole was obtained.

Thereafter the aluminum foil was etched away by means of hydrochloric acid. As a result of 25 μm thick film of polybenzoxazole plastic coated with a 5 μm thick copper layer was obtained. The plastic film proper had high flexibility and very good heat resistance at temperatures up to 250°C. The tensile strength was 1050 kp/cm² at 20°C.

EXAMPLE 13

An aluminum foil having a thickness of 50 μm was washed at room temperature in an alkaline solution containing 5% NaOH. The foil was then treated in a solution containing 5% NaOH, 0.5% ZnO and 0.1% $FeCl_3$. After this treatment the aluminum foil was coated with a thin layer of zinc (< 0.3 μm). At this stage it would have been possible to plate the foil with copper, for instance in a copper cyanide solution. In an acid copper solution the result might, however, not be good, because of the difficulty of avoiding blistering.

In order to treat the foil so that a better result would be obtained with plating in an acid copper solution, the zinc coated foil of aluminum was immersed in a solution containing 40 g/l $NiCl_2 . 6H_2O$. By means of sulphuric acid the acidity of the solution was adusted to pH = 2. By an electrochemical reaction zinc was replaced by nickel in this solution, that is, metallic nickel was precipitated on the foil while zinc was dissolved. It should be pointed out that it is important that the treatment is carried out within a correctly adjusted time period. A period of treatment which is too short will result in a layer of nickel, which is unevenly distributed over the surface of the foil so that zinc and also aluminum metal will be exposed to the acid copper solution subsequently applied. On the other hand, with too long a period of treatment in the nickel solution the aluminum foil under the layer of zinc will be attacked to an unpermissible extent so that it will be weakened. The correct duration of the treatment in the above mentioned solution of nickel appeared to be between 30 and 150 seconds at room temperature.

The nickel coated foil was plated at room temperature in a solution containing 220 g/l $CuSO_4 . 5H_2O$ and 100 g/l $H_2SO_4$, first during a period of 135 seconds with a current density of 3 A/dm², then during 45 seconds at 14 A/dm² and finally during 60 seconds at 4 A/dm². After this treatment the foil had a coating of copper the thickness of which was about 5 μm. The free surface of the copper coating had a structure that resulted in good adhesion to the final base, for instance an epoxy laminate.

The foil thus produced was washed and dried, whereafter it was placed on a few sheets of epoxy resin impregnated glass web with the copper coated surface facing said sheets. After molding at increased temperature for hardening the epoxy resin a laminate was obtained consisting of an electrically insulating plate of glass fiber reinforced epoxy plastic with a metal foil bonded to its surface. The production of this laminate could be performed without blistering occurring between the layers of metal. The aluminum foil was etched away in a hydrochloric acid solution. The laminate finally obtained consisted of a layer of copper having a thickness of about 5 μm directly bonded to the epoxy plastic and covered by a thin (thickness less thant 0.5 μm) layer of nickel.

At the manufacture of the printed circuit the thin layer of nickel can be removed from the copper, if necessary. A rapid and easy method for such removal is etching in ferric chloride solution. As this solution also dissolves copper, the length of the period must be carefully adjusted, so that the treatment is interrupted when the nickel is removed and before an appreciable part of the copper is etched away. A somewhat more complicated but more reliable method is electrochemical elimination, at which the nickel can be removed selectively. Such a method will be described in the following example.

EXAMPLE 14

A laminate is produced as described in Example 13. After the aluminum foil was removed, the copper was found to be covered by a layer of nickel, the thickness of which was about 0.2 $\mu$m. The metal coating on the laminate was used as an anode in an electrolytic cell containing a solution which was free of halogen and consisted of three parts of concentrated sulphuric acid and two parts of distilled water at room temperature. With a current density of 2 A/dm$^2$ the layer of nickel was dissolved out without noticeable attack on the copper layer.

The thin layer of nickel can thus be removed from the copper in various manners, If desired. However, it was shown to be possible to produce printed circuits without removal of the nickel layer. At a so called through-holes plating with simultaneous increase of the thickness of the conductors by plating with copper a good adhesion between the copper and the nickel layer was obtained.

In the manufacture of certain types of printed circuits the thin layer of nickel may be of great advantage. In this case the thickness of the nickel layer may, if required, be increased by electrolytic plating. Printed circuits having nickel coated conductors of copper enable connection of electronic components by welding instead of soldering and this may be required at, for instance, printed circuits with a high degree of miniaturization This is a further advantage with the invention in addition to the advantages mentioned above in connection with the plating process.

EXAMPLE 15

A rolled foil of aluminum having a thickness of 50 $\mu$m was rinsed in a solution of 5% by weight of NaOH in water during 5 minutes at 20°C. Thereafter the foil was washed in water and was then plated at 60°C. in a water solution containing

| | |
|---|---|
| Cu$_2$P$_2$O$_7$ . 4 H$_2$O | 40 g/l |
| H$_2$C$_2$O$_4$ . 2 H$_2$O (oxalic acid) | 60 g/l |
| K$_4$P$_2$O$_7$ | 90 g/l |
| NH$_4$OH to pH = 5.7 | |

After the plating the foil was washed and dried, whereafter it was placed on a few sheets of an epoxy resin impregnated glass web with the copper coated surface facing said sheets. After molding at a pressure of 50 kp/cm$^2$ and a temperature of 165°C. during 45 minutes a laminate was obtained from which the foil of aluminum could easily be peeled off by hand. The adhesion between aluminum and copper was measured according to ASTM D-1867 and is shown in the following table which also indicates the values of the current density and the plating time at the process.

Table

| Example | Current Density A/dm$^2$ | Plating time seconds | Adhesion lbs/inch |
|---|---|---|---|
| 1 | 5.7 | 300 | 0.03 |
| 2 | 8.6 | 200 | 1.07 |
| 3 | 11.4 | 150 | 1.47 |

The adhesion was measured according to ASTM D-1867.

The copper plated aluminum foil could be handled without the layers of metal becoming separated from each other. It also turned out to be possible to roll up the foil on a cylindrical rod and then unroll it without the copper being loosened from the aluminum foil. As the laminate has been molded and the aluminum foil had been peeled off a copper layer having a thickness of about 5 $\mu$m was obtained on the final base. By etching in 20% ammonium persulphate all the copper could be removed from the surface of the epoxy laminate, that is, no penetration of resin through the micropores could be observed.

The present invention is not limited to the embodiments and examples shown and described since they can be modified in different manners within the scope of the invention.

What is claimed is:

1. A method for the production of a material for use in the production of printed circuits comprising applying a thin layer of zinc to a foil of aluminum or an aluminum alloy galvanically replacing the layer of zinc wholly or partly, by a layer of a metal selected from the group consisting of nickel, iron, chrome, tin, cadmium and cobalt and plating a layer of copper to the metal layer.

2. The method according to claim 1 in which the thickness of the nickel layer exceeds 0.01 $\mu$m and is less than 1 $\mu$m.

3. The method according to claim 1 in which the replacement of zinc by nickel is carried out in a solution in which the concentration of Ni++ is 2 to 25 g/l.

4. The method according to claim 1 in which the replacement of zinc by nickel is carried out in a solution in which the concentration of Ni++ is 5 to 15 g/l.

5. The method according to claim 1 in which the replacement of zinc by nickel is carried out in a solution in which the concentration of Ni++ is 8 g/l.

6. The method according to claim 1 in which replacement of zinc by nickel is carried out in a solution containing nickel chloride.

7. The method according to claim 1 in which the replacement of zinc by nickel is carried out in a solution in which the pH value is between 0.5 to 5.

8. The method according to claim 1 in which the replacement of zinc by nickel is carried out in a solution in which the pH value is between 1 and 3.

9. The method according to claim 1, in which the electroplating of copper on the layer of nickel is carried out in an acid copper solution.

* * * * *